United States Patent
Knips et al.

(10) Patent No.: US 11,657,887 B2
(45) Date of Patent: May 23, 2023

(54) TESTING BIT WRITE OPERATION TO A MEMORY ARRAY IN INTEGRATED CIRCUITS

(71) Applicant: International Business Machines Corporation, Armonk, NY (US)

(72) Inventors: Thomas J. Knips, Wappingers Falls, NY (US); Uma Srinivasan, Poughkeepsie, NY (US); Daniel Rodko, Poughkeepsie, NY (US); Matthew Steven Hyde, Wappingers Falls, NY (US); William V. Huott, Holmes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/477,715

(22) Filed: Sep. 17, 2021

(65) Prior Publication Data
US 2023/0089274 A1 Mar. 23, 2023

(51) Int. Cl.
*G11C 29/38* (2006.01)
(52) U.S. Cl.
CPC .................................. *G11C 29/38* (2013.01)
(58) Field of Classification Search
None
See application file for complete search history.

(56) References Cited

U.S. PATENT DOCUMENTS

| | | | | |
|---|---|---|---|---|
| 5,875,195 A | * | 2/1999 | Dixon | G06F 11/261 |
| | | | | 714/719 |
| 6,075,721 A | * | 6/2000 | Runaldue | H04Q 3/54591 |
| | | | | 365/230.06 |
| 7,139,946 B2 | * | 11/2006 | Nadeau-Dostie | G11C 29/025 |
| | | | | 365/201 |
| 9,443,615 B2 | | 9/2016 | Johnson et al. | |
| 2008/0013389 A1 | | 1/2008 | Kim et al. | |

OTHER PUBLICATIONS (Lien et al.), "Output Bit Selection Methodology for Test Response Compaction", (2016) IEEE International Test (Year: 2016).*
Burmeister et al., "Separate Microcode-Controlled Write Lines for Data and ECC Check Bits," IPCOM000060487D, IP.com, TDB 04-86, pp. 4902-4903, Apr. 1, 1986, 3 pages.
Duffield et al., "Selective Register Bit Set/Reset Mechanism," IPCOM000057543D, IP.com, TDB 05-88, pp. 402-405, May 1, 1988, 5 pages.
Lien et al., "Output Bit Selection Methodology for Test Response Compaction," 2016 IEEE International Test Conference (ITC), Paper TC.2, 2016, pp. 1-10.

* cited by examiner

*Primary Examiner* — April Y Blair
*Assistant Examiner* — Matthew W Wahlin
(74) *Attorney, Agent, or Firm* — Cantor Colburn LLP; Jeffrey Ingalls

(57) ABSTRACT

A method for testing a circuit includes performing, by a test engine, a test of bit write to a memory. The test includes defining a bit group based on a set of bits from an address of a memory location. The test further includes generating a bit mask for the bit group. The test further includes performing a bit write operation to the address to store a sequence of bits, the sequence of bits selected using a predetermined bit pattern. The test further includes reading content of the address. The test also includes comparing, using the bit mask, only bits corresponding to the bit group from the sequence of bits and from the content of the address.

17 Claims, 6 Drawing Sheets

TESTING BIT WRITE OPERATION TO A MEMORY ARRAY IN INTEGRATED CIRCUITS

BACKGROUND

The present invention relates to computing technology, particularly integrated circuit chips, and more particularly to perform bit write test coverage using dynamic masking.

An integrated circuit chip (IC chip, or chip) may include functional circuits, such as arithmetic logic unit (ALU), floating-point unit (FPU), registers, ports, scan latches, and memory. In order to ensure the quality of the chip, certain additional circuits are added to the chip for testing, repair, and test results logging. These circuits may include built-in self-test (BIST) engines, memory built-in self-test (Mem-BIST) engines, logic built-in self-test (LBIST) engines, and built-in self-repair (BISR) engines. Additional circuits, latches, and memory, such as failed logic registers and failed address registers, are typically added to the chip to store test results from these BIST engines. There is a trade-off as to how much of this information is retained on-chip (costing chip area) before being extracted by the tester vs. extracting fail data more frequently with the tester (costing more test time, but less chip area). It is desirable to have a chip test scheme that requires minimal test time for chip testing and minimal chip area for storing chip test results.

SUMMARY

According to one or more embodiments of the present invention, a method for testing a circuit includes performing, by a test engine, a test of bit write to a memory. The test includes defining a bit group based on a set of bits from an address of a memory location. The test further includes generating a bit mask for the bit group. The test further includes performing a bit write operation to the address to store a sequence of bits, the sequence of bits selected using a predetermined bit pattern. The test further includes reading content of the address. The test also includes comparing, using the bit mask, only bits corresponding to the bit group from the sequence of bits and from the content of the address.

According to one or more embodiments of the present invention, a system includes a memory element that is to be tested, a circuit that generates a dynamic bit mask, and a test engine coupled with the memory element and the circuit. The test engine tests a bit write operation to the memory element by performing a method. The method includes defining a bit group based on a set of bits from an address of a memory location. The method further includes generating a bit mask for the bit group. The test further includes performing a bit write operation to the address to store a sequence of bits, the sequence of bits selected using a predetermined bit pattern. The method further includes reading content of the address. The method also includes comparing, using the bit mask, only bits corresponding to the bit group from the sequence of bits and from the content of the address.

According to one or more embodiments of the present invention, an apparatus for implementing diagnostics of a circuit includes a test engine to test a memory element of the circuit by testing a bit write operation to the memory element by performing a method. The method includes defining a bit group based on a set of bits from an address of a memory location. The method further includes generating a bit mask for the bit group. The test further includes performing a bit write operation to the address to store a sequence of bits, the sequence of bits selected using a predetermined bit pattern. The method further includes reading content of the address. The method also includes comparing, using the bit mask, only bits corresponding to the bit group from the sequence of bits and from the content of the address.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
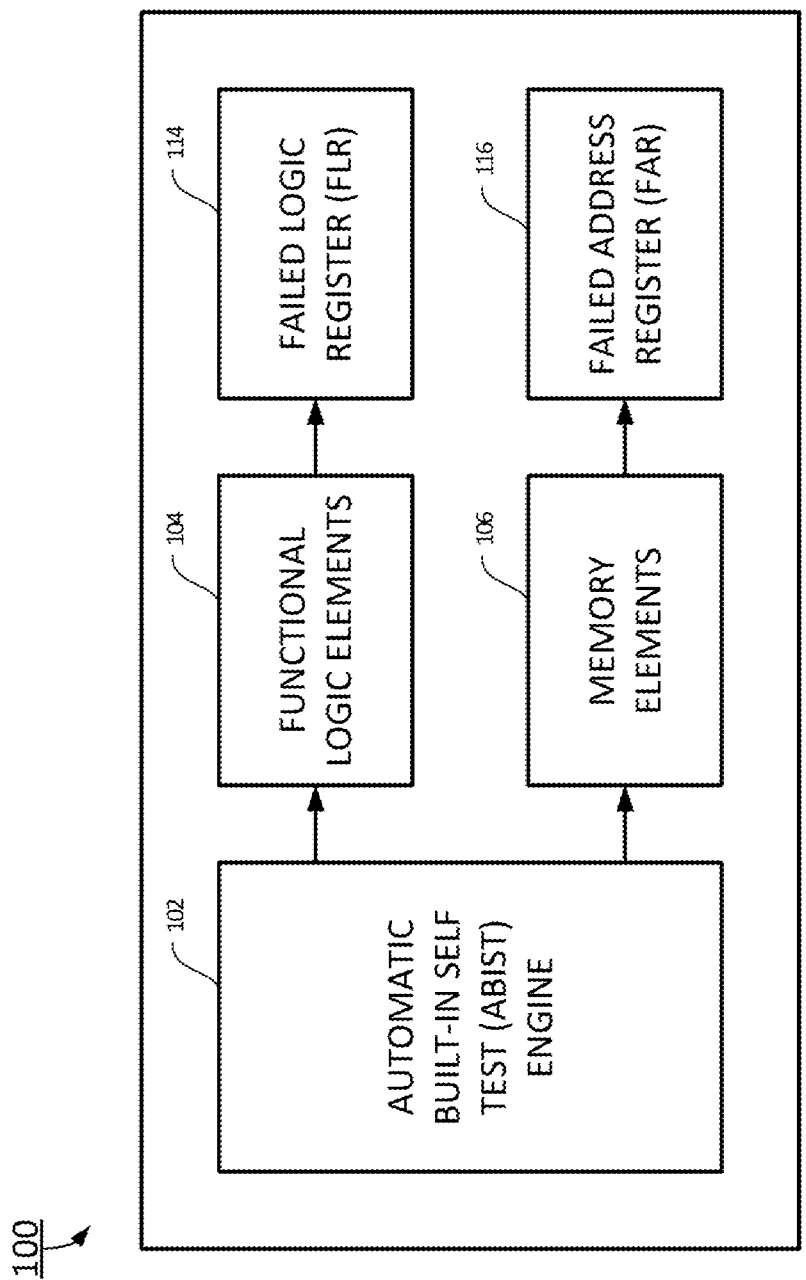
FIG. 1 is a block diagram showing an integrated circuit chip having its functional elements and additional elements for testing and repairing according to one or more embodiments of the present invention.

The diagrams depicted herein are illustrative. There can be many variations to the diagrams, or the operations described therein without departing from the spirit of the invention. For instance, the actions can be performed in a differing order, or actions can be added, deleted, or modified. Also, the term "coupled," and variations thereof describe having a communications path between two elements and do not imply a direct connection between the elements with no intervening elements/connections between them. All of these variations are considered a part of the specification.

DETAILED DESCRIPTION

Embodiments of the present invention facilitate improvements to a built-in self-test (BIST) of one or more integrated chips. An integrated circuit chip (IC chip, or chip) may include normal functional circuits, such as arithmetic logic unit (ALU), floating-point unit (FPU), registers, scan latches, and memory. In order to ensure the quality of the chip, certain additional circuitries are added to the chip to test the chip, to store the test results, and to repair the chips according to the test results. These circuitries may include a BIST engine, a memory built-in self-test (MemBIST) engine, and a built-in self-repair (BISR) engine. Additional memory, such as failed logic registers and failed address registers (FAR), may be added to store test results from these BIST engines. Embodiments of the present invention improve BIST capabilities by providing bit write test coverage using dynamic data bit masking.

Conventionally, a memory chip may include column write enable control and redundancy steering control. Under certain circumstances, a memory location needs to be updated or tested only to one or more specific bits instead of a whole word. This is known as "bit write." In other words, bit write capability in memory arrays provides for partial writes to a memory array address. Keeping track of expect data required for comparing array data read during a memory test is a technical challenge. Determining the expect data (i.e., expected data after test) for testing bit write capability is cumbersome and expensive in hardware because of the test time required to adequately maintain an appropriate expect data field to use for a memory array data error checking.

Embodiments of the present invention address such technical challenges by using the bit write as an 'address' function for selectable/individual data bit tests, and providing dynamic data bit masking for error check of targeted bits 'addressed' by the bit writes during such tests.

Exemplary embodiments of the present invention relate to, among other things, integrated circuit chip (hereinafter chip) testing and repairing. In certain embodiments, the chip may include, central processing units (CPUs), digital signal processing (DSP) chips, graphical processing units (GPUs), system-on-a-chip (SOC), three-dimensional integrated circuits (3D-IC), application-specific integrated circuits (ASICs), and various memory chip such as volatile memory, random access memory (RAM), nonvolatile random access memory (NVRAM), read-only memory (ROM), programmable read-only memory (PROM), erasable programmable read-only memory (EPROM), and solid-state drive (SSD).

Referring now to FIG. 1, a block diagram showing an integrated circuit chip (chip) 100 having its functional elements and additional elements for testing and repairing according to certain embodiments of the present disclosure. The chip 100 may include one or more functional logic elements 104, and one or more memory elements 106. The functional logic elements 104 of the chip 100 may include one or more cores, one or more processing logic units, one or more arithmetic logic units (ALU), one or more floating-point units (FPU), one or more registers, one or more scan latches, and other necessary functional logic units to perform the functional the chip is designed to perform. The chips may also include memory elements 106 of various sizes. In certain embodiments, the chip 100 may be a memory chip and contains memory cells in different capacities.

In one or more embodiments of the present invention, the memory element 106 can be a multi-port array. Multi-port arrays require concurrent access to data storage at the same time. This, in particular, applies to parallel systems comprising a large number of processors. In such systems, typically, a large number of instructions and data are processed in parallel, including multiple access to the same memory element 106. Various dynamic and/or static multi-port memory cells are known in the VLSI system design, and any of them can be used as the memory elements 106. In one or more embodiments of the present invention, the memory element 106 uses a random-access port and a serial access port, where data are transmitted from the random-access port to serial access port via a data register. Alternatively, in other embodiments, the memory element 106 is a two-port memory cell, which can be configured to perform as one port or two-port memory cells. Additional ports can be added to allow, for example, the use of the cell in a three-port register array.

In order to ensure the quality of the chip 100, additional circuitries may be included in the chip 100 to test, verify, and potentially repair the chip. These circuitries may include a BIST engine 102. The BIST engine 102 is used to test the functional logic elements 104, the memory elements 106, and any other elements of the chip 100. These tests yield certain test results, and these test results should be preserved for product quality determination, and/or for potential repair if additional redundancy elements are designed and built-in. In certain embodiments, the test results for functional logic elements 104 may be stored in one or more failed logic registers (FLR) 114, and the test results for memory elements 106 may be stored in one or more failed address registers (FAR) 116.

In certain embodiments, the one or more FLRs 114 may be pass/fail checkers, multiple-input-signature-registers (MISRs), or other checksum registers. In certain embodiments, FARs essentially capture the failing addresses of the memory under test and store them until testing is complete, allowing this information to be used for the potential repair of, (or rejection of), the memory under test, as well as provide diagnostic, analytic, and defect bit fail map data for yield learning. There may be multiple embodiments of FARs. These include "dedicated FARs," where each memory array instance on-chip has "dedicated FARs," and "shared FARs," where multiple memory array instances have their responses combined and failing addresses combined into 1 set of FARs. Shared FARs are generally employed in an effort to use the on-chip FAR area more efficiently. Because not all memory instances may require repairs and they rarely require the maximum number of possible repairs, sharing FARs allows the memory instances that need more repairs to use FAR space that is not needed by memory instances that don't need as many repairs. While this helps to reduce the FAR overhead on-chip, it is still common to need to do multiple passes of testing in order to extract all of the FAR data because it is often too costly to provide enough FAR area on-chip to store all the repairs needed by all of the memory instances.

During integrated circuit memory and logic testing, test results, signatures and other fail data are often collected and used for: (a) pass or fail determination, (b) partial good determination (where only part of the chip may be good and usable), (c) possible repair information for the device under test, (d) diagnostics for failing devices or sections of devices, and (e) analytics of fail data from improved yield learning.

Figure 2:
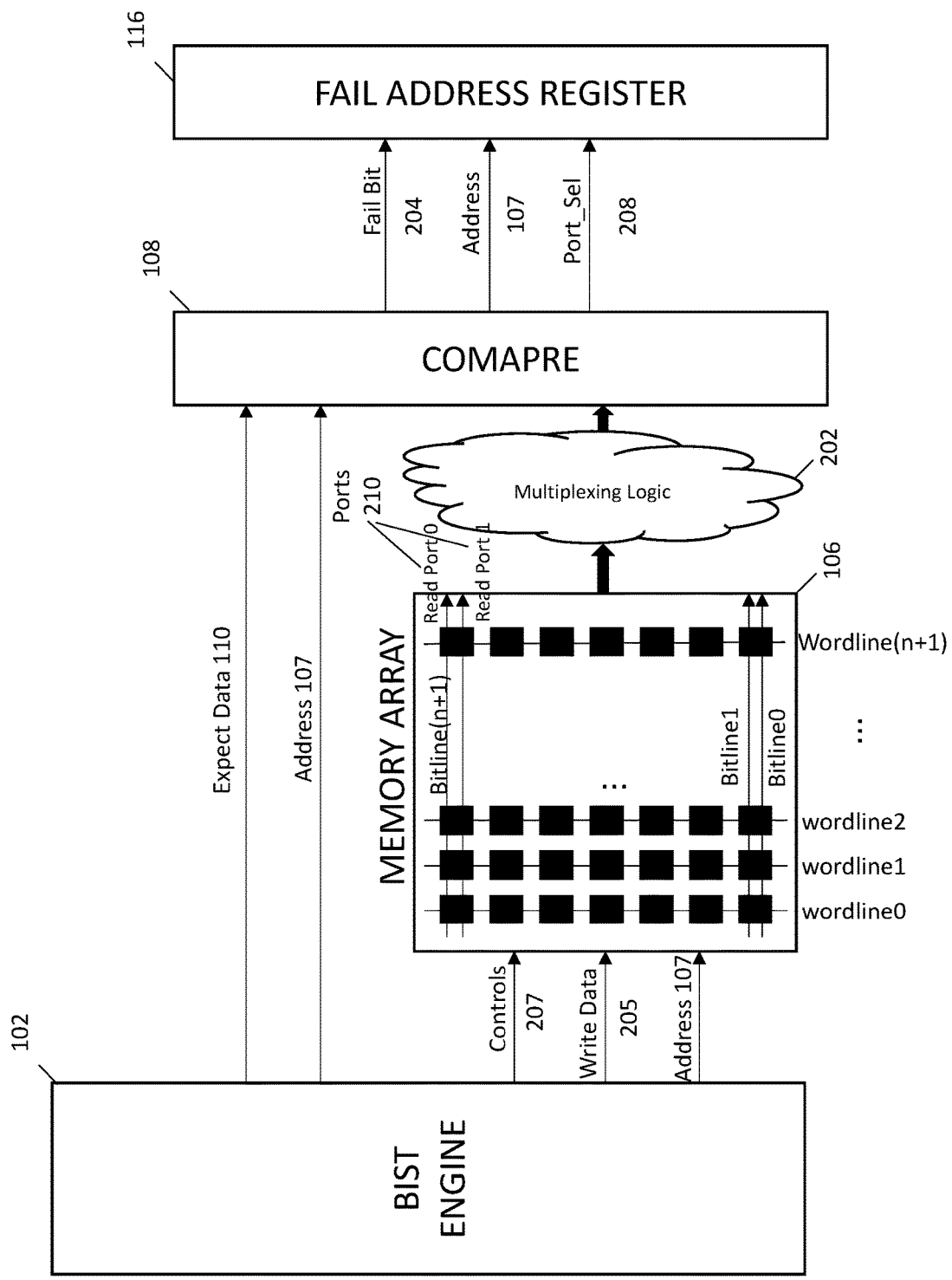
FIG. 2 shows a typical BIST implementation represented by memory array test system support elements and their configuration.

FIG. 2 shows a typical BIST implementation represented by memory array test system support elements and their configuration. The failure detection support described herein is, but not restricted to, two dimensional in reference to the row and column addressing within the structure of a memory 106 under test. There may exist a plurality of redundant row and column elements, thus supported by support registers 206. The support registers can include the FLR 114, and the FAR 116. The BIST engine 102 provides the deterministic array test patterns 107. The compare function 108 has as its inputs, the expected data vector 110, and the memory array outputs 112. It provides an overall pass/fail result signal 124, which is used in combination with the gating controls 126 from the BIST engine 102 to control the support registers 206 in establishing a failure/defect.

The compare function 108 may be used to implement an N-bit compare of the data out bus 112 of the memory 106

(e.g., dataouts 0:N) and the expect data bus 110 (e.g., 0:N) from the BIST engine 102. Overall, BIST error detection may then be accomplished as an N-way logical 'OR' determining if any mis-compare has occurred on a cycle-by-cycle basis. The error signal, or mis-compare, is also referred to as an 'rtfail' or real-time fail signal. For example, in memory array applications with two dimensional redundancy, whereby one dimension is in terms of row addressing, and the second dimension is in terms of column addressing across one or all data bits of the memory array, then this compare result bus 314 or overall error detection provides for a sufficient determination of a fail and location for purposes of result propagation to the support register apparatus 206.

The memory array read and memory array write functionality may be tested according to a read-write vector. A data vector may be written to a group of memory addresses defined by a memory address vector, and the read-write vector may determine which of the particular memory addresses are read or written.

A bit write vector may be used to control write functionality to specific bits or bit groups associated with the memory array 106. The bit write vector may include logical TRUE and FALSE bits for allowing a particular bit to be written (e.g., TRUE) or preventing writing to the particular bit (e.g., FALSE). As such, the bit write vector may provide a distinct control function to be tested. Circuitry may be required to test bit write functionality as bit write enablement may introduce errors independent or coinciding with data written to the memory array. Erroneous data written to the memory array 106 may not be detected with other comparison data provided by the BIST engine 102. Additional comparison data may be necessary to determine the proper operation of bit write.

The memory array 106 may allow for partial write (e.g., only write a partial row). As noted, for testing such partial writes the BIST engine 102 has to keep track of the bit patterns across a row as the expect data after completion of the write operation for a partial row. This can be a technical challenge because tracking such bit patterns can be expensive, because the BIST has to build up the registers etc. to store the bit pattern for the comparisons. In some embodiments of the present invention, the bit pattern may also have to be stored after the tests for repairing, reporting, etc. Further, the technical challenges include the use of multiple instructions to complete the test for such partial writes, which results in the existing solutions that use such techniques to take a long time to complete the test. Such tests also do not consider simultaneously reading/writing into separate portions of the memory array 106.

Embodiments of the present invention address such technical problems by treating the bit write as an 'address' function for selectable/individual data bit test, and providing dynamic data bit masking for error check of targeted bits 'addressed' by the bit writes during test.

Figure 3:
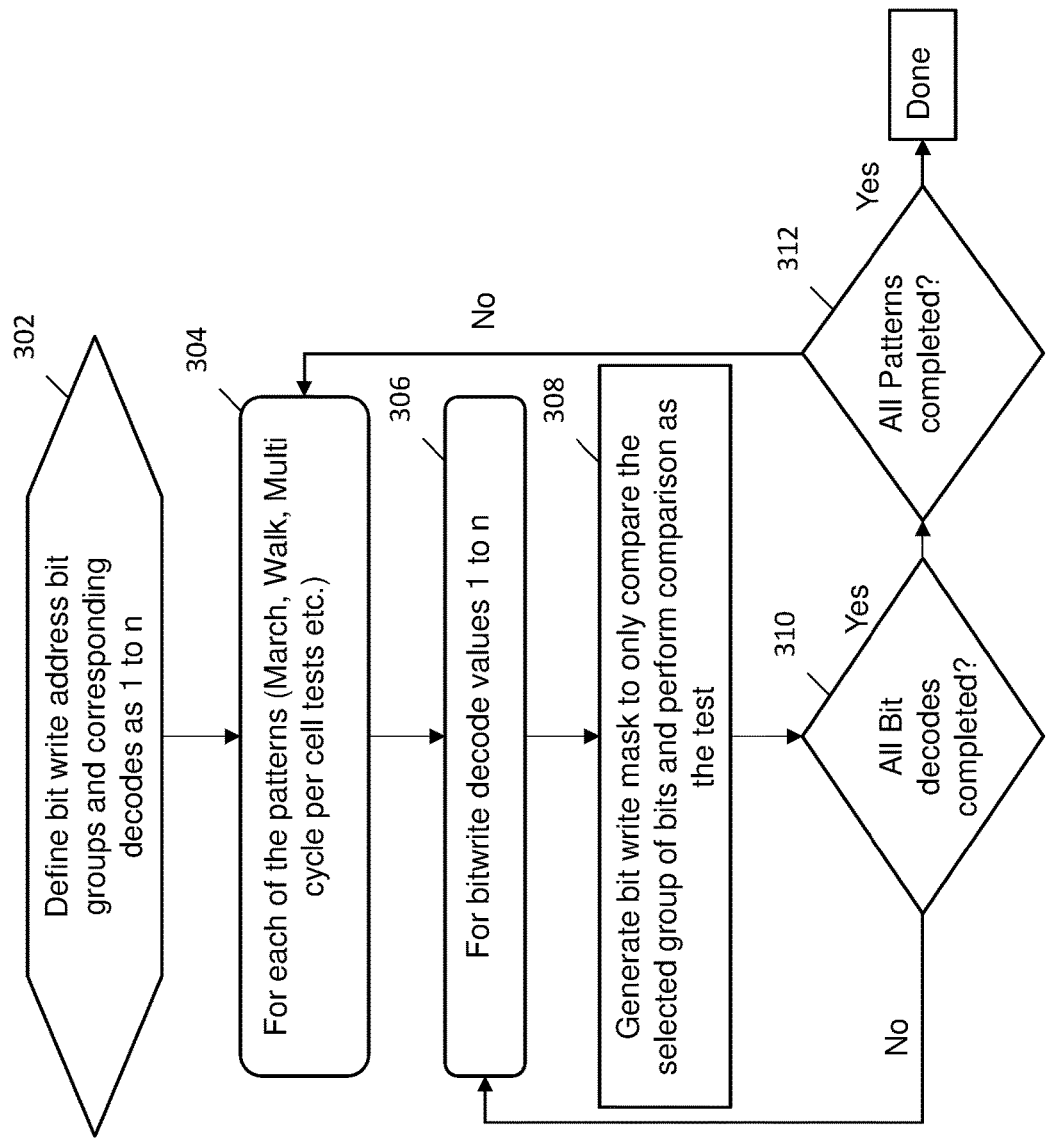
FIG. 3 depicts a flowchart of a method for testing bit write capabilities using dynamic masking according to one or more embodiments of the present invention.

FIG. 3 depicts a flowchart of a method for testing bit write capabilities using dynamic masking according to one or more embodiments of the present invention. The method 300 that is depicted includes, at block 302, defining a set of bit write address bit groups and their corresponding decodes within a predetermined range of 1 to n. The bit groups can be established to be a predefined m bits in one or more embodiments of the present invention. A "decode" is a multi-input, multi-output combination that converts a binary code of m input lines into one of the n outputs. Table 1 provides an example of binary encoding/decoding where 3-bit input (encode) is converted into an 8-bit output (decode). A "decode" is a multi-input, multi-output combination that converts a binary code of n input lines into one of the m outputs.

TABLE 1

| Encode | Decode |
|--------|----------|
| 000 | 00000001 |
| 001 | 00000010 |
| 010 | 00000100 |
| 011 | 00001000 |
| 100 | 00010000 |
| 101 | 00100000 |
| 110 | 01000000 |
| 111 | 10000000 |

Figure 4:
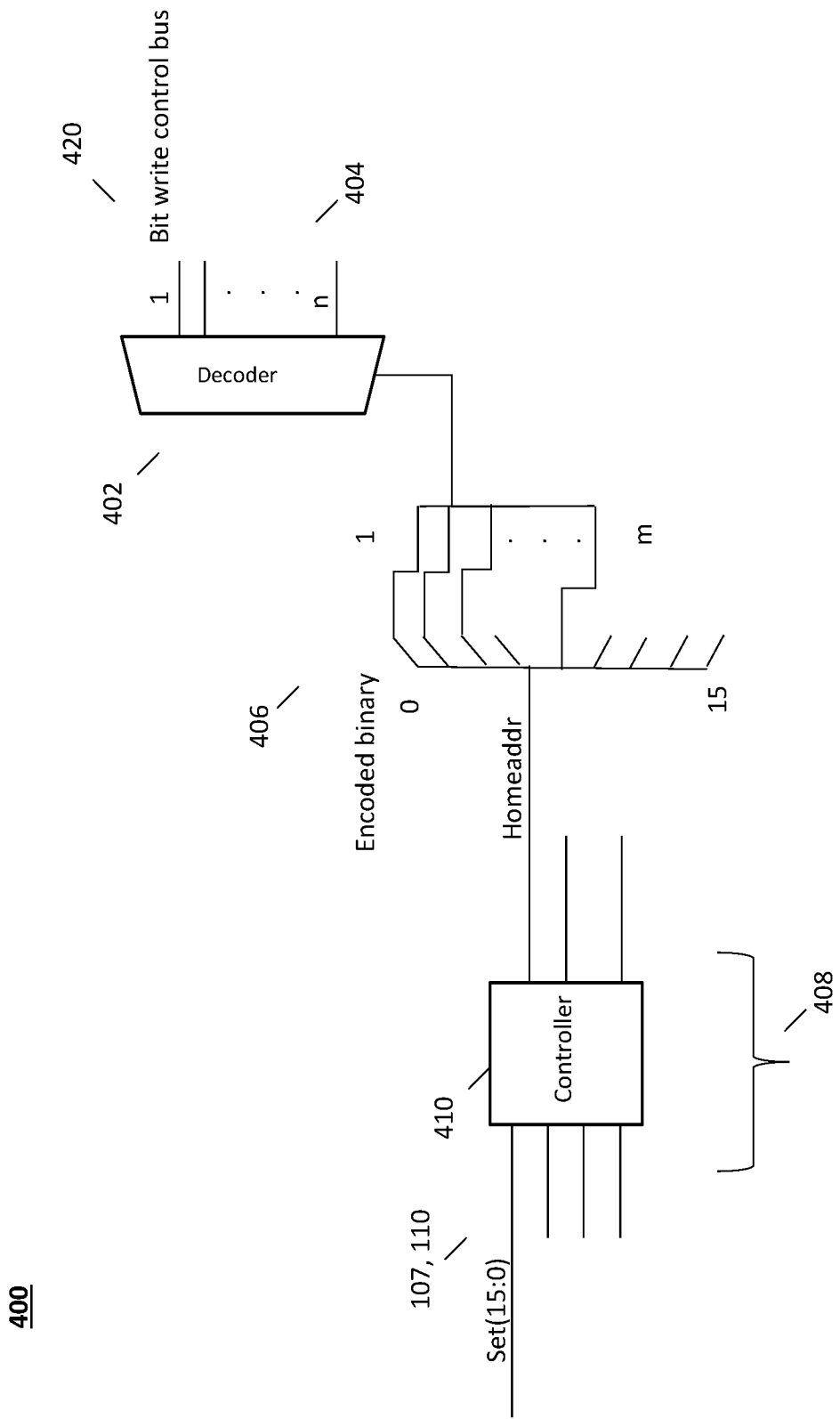
FIG. 4 depicts a block diagram of a circuitry that can be used to generate the bit write address bit groups according to one or more embodiments of the present invention.

FIG. 4 depicts a block diagram of circuitry 400 that can be used to generate the bit write address bit groups according to one or more embodiments of the present invention. A decoder 402 receives a predetermined number of input bits 404, say 1 to n. The input bits 406 are part of the address 107 that is to be tested. The decoder 402 generates a corresponding encoded binary number 404 in the predetermined range of 1 to m (e.g., 16, 32, etc.). The decoder 402 can be a n:m decoder, where n and m can take different values. In one or more embodiments of the present invention, the m and n are predetermined. Alternatively, or in addition, in one or more embodiments of the present invention, m and/or n can be dynamically programmed.

In one or more embodiments of the present invention, the input bits 410 are predetermined bits from the address 107 (e.g., bits 0, 1, 2; or bits 0, 2, 7, etc.).

In one or more embodiments of the present invention, the bit pattern of the encoded binary number 406 is used as the write data 205, and the expect data 110 that is written to the address 107. The bit pattern of the decoded binary number 404 is used as the write controls 207 that is written to the address 107, and the dynamic mask circuit inputs 502 enabling appropriate compare with expect data 110. Alternatively, or in addition, in some embodiments of the present invention, the encoded number 406 is modified using one or more inputs 408, and the result of the modification is used as the write controls 207 that is written to the address 107 (also used as the dynamic mask circuit inputs 502 enabling appropriate compare with the expect data 110).

In one or more embodiments of the present invention, a controller 410 receives the one or more inputs 408. The controller 410 outputs the encoded binary representative address 406, decoded to (404) the write control bus 420 (also used as the dynamic mask circuit inputs 502 enabling appropriate compare with expect data 110).

In one or more embodiments of the present invention, the circuitry 400 is used to generate the write controls 207 for the write data 205 and dynamic mask circuit input 502 in this manner if the bit write control bus 420 indicates that a bit write compare test is to be performed by the BIST engine 102. The output of the circuitry 400 is used as a dynamic mask to compare only selected bit groups from the data out bus that is used for the bit write operation to store data into the memory 106.

Referring to the flowchart of the method 300, at block 304, the BIST engine 102 selects one from a predetermined list of bit pattern testing algorithms to test the bit write capability. For example, the predetermined list of bit pattern testing algorithms can include March Pattern Tests (e.g., Zero-One, Modified Algorithmic Test Sequence, March Y, March C-, March X, etc.), Walking I/O Pattern Test, Butterfly, Moving Inversion, Multi-cycle Test, etc. The BIST engine 102 selects each of the testing algorithms sequentially to execute.

At block 306, as per selected testing algorithm, and for the bit write decode value, the BIST engine 102 generates a bit write mask to only compare the selected group of bits (at block 302). The comparison is performed to test the bit write, at block 308.

Figure 5:
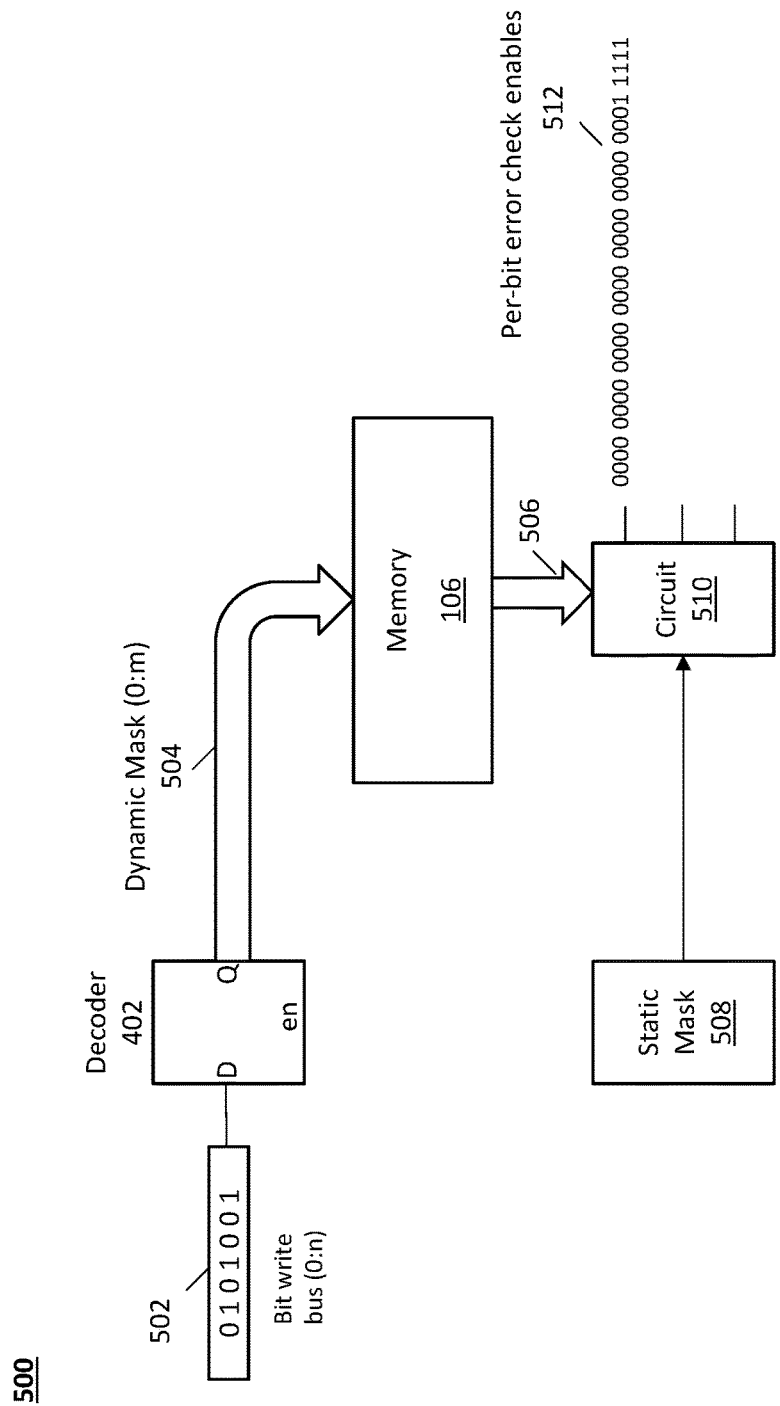
FIG. 5 depicts a block diagram of a circuitry that uses the bit write mask according to one or more embodiments of the present invention.

FIG. 5 depicts a block diagram of circuitry 500 that uses the bit write mask according to one or more embodiments of the present invention. The depicted circuitry 500 can be used by the compare logic 108 to compare the data out 502 that is being written into the memory 106 with the expect data 110 that is being read out from the memory 106.

For the comparison, the compare logic 108 uses the decoded binary 404 as a dynamic mask 504 to filter the data out 502 controlled by the decoded bit write bus 420. The result 506 of the dynamic mask setting is combined with any static mask 508 facilities that may be employed resulting in appropriate error check enables 512 for each data bit read from the memory and compared against the expect data facilities 110. Each bit of the expect data 110 is compared individually with each bit read from the memory 106. The per bit comparison can be further enabled/disabled by using multiple static masks 508, in one or more embodiments of the present invention. Each static mask 508 can be used, in one or more embodiments of the present invention, to over-ride the dynamic masks through circuit 510 resulting in per bit error check enables 512 used to control the compare results of each data bit read from the memory and the expect data 110.

The dynamic error check mask accordingly provides capability to error check the portion(s) of data out bus updated with the bit write controls to the memory array 106. Conversely, capability to exclude the updated portions can be provided instead of identifying the bits to compare as described above. Multi-cycle per cell tests, including write after read can provide maximum disturb test coverage when using such dynamic masks.

As shown in FIG. 3, the test is repeated multiple times. At block 310, the test is repeated at least for a number of times equivalent to the encoded binary number 406. Further, at block 312, the test (with the repetitions for the encoded binary number 406) is repeated for each bit pattern algorithm that was selected.

Figure 6:
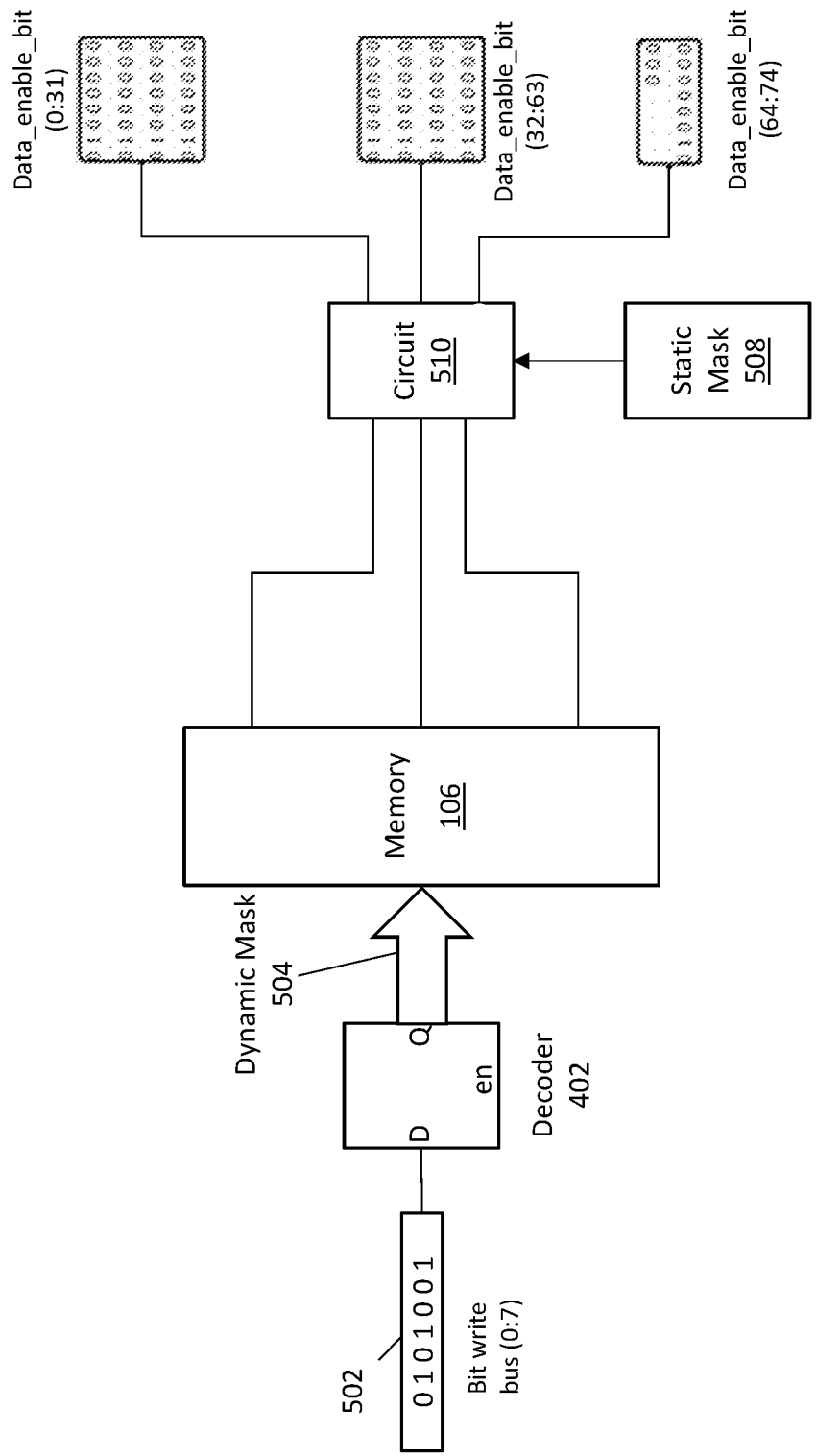
FIG. 6 depicts an example scenario for bit write testing according to one or more embodiments of the present invention.

FIG. 6 depicts an example scenario for bit write testing according to one or more embodiments of the present invention. In the depicted example system 600, three (3) bits from the address 107 are used to define bit write address groups using modulo 8. A first group of bits 0-31, a second group of bits 32-63, and a third group of 64-74 are defined. The dynamic mask 504 is generated for each of these groups based on the three address bits. Only the selected bits according to the dynamic mask 504 are compared. The static masks 508 are used to filter the data being read from the memory 106 so that the appropriate group of bits is compared.

An example memory array 106 in this example could be comprised of 75 data bits that can be written and subsequently read from the array. 75 individual write controls 107 are also provided yielding capability to blanket write all 75 bits if all set to the same values, or individual capability to write/modify only one of the 75. Therefore, the limiting cases are from 1 to 75. According to one or more embodiments of the present invention, for the single or individual bit case above, 7 encoded binary address bits 406 are used, decoded to 128 possible decodes 404, of which 75 usable states can be used as the bit write control bus 420 and the dynamic mask input bus 502 providing for testing the memory array as if it were a single data bit written and read from every address of the array×75 addresses assigned for the data bit positions.

FIG. 6 depicts a proposed case example where 3 encoded binary address bits 406 would be used decoded to 8 possible decodes 404, of which 8 usable states would be employed as the bit write control bus 420 and the dynamic mask input bus 502 providing for testing the memory array as if it were 9 or 10 data bits written and read from every address of the array×8 addresses assigned for the data bit positions. The memory array write controls (0:74) would be connected to the write control bus 420 as bits (0:7,0:7,0:7, 0:7,0:7,0:7, 0:7,0:7,0:7,0:2) making up the 75 bit write control bus in modulo 8 fashion. Similarly, the bit write control bus 502 in FIG. 6 is stage through the dynamic mask register 504 and if required merged with the 75 bit static mask facilities 508 in a modulo 8 fashion mirroring the connections made at the memory array write control data bus described above. The error check functions of the compare block 108 would then be enable for every $8^{th}$ data bit read from the memory array.

Embodiments of the present invention improve the self-testing of chips and provide an improvement to computing technology. Further, embodiments of the present invention provide a practical application to improve the self-testing of chips. The improvement includes at speed bit write compares without having to store the bit patterns that are to be compared into registers. This technical challenge is addressed by the technical solutions herein using bits from the address of the bit writes to determine bit groups to be compared from the bit write bus and the memory.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other devices to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

What is claimed is:

1. A method for testing a circuit, the method comprising:
performing, by a test engine, a test of bit write to a memory, the test comprising:
    defining a set of bit write address bit groups and their respective decodes based on a set of input bits from an address to be tested of a memory location, wherein each respective decode comprises a multi-input, multi-output combination that converts a binary code of M input lines into one of N outputs, and wherein the set of input bits are taken from predetermined bit locations in the address;
    generating an encoded binary number in a predetermined range of 1 to M based on the set of input bits from the address;
    generating, from the encoded binary number, a decoded binary number in a predetermined range of 1 to N;
    generating, from a bit pattern of the decoded binary number, a bit mask for the bit groups;
    generating, from a bit pattern of the encoded binary number, expect data;
    performing a bit write operation comprising a partial write to the address to store a sequence of bits, the sequence of bits selected using a predetermined bit pattern testing algorithm configured to test bit write capability;
    reading a content of the address; and
    comparing bits selected using the bit mask to the expect data.

2. The method of claim 1, wherein the test engine is a built-in self-test engine of the circuit.

3. The method of claim 1, further comprising:
repeating the test for a number of times equal to the encoded binary number.

4. The method of claim 1, wherein the predetermined bit pattern is selected based on a predetermined selected algorithm.

5. The method of claim 4, wherein the test is repeated with a plurality of predetermined bit patterns.

6. The method of claim 1, wherein the set of bits from the address is a predetermined selection.

7. A system comprising:
a memory element that is to be tested;
a circuit that generates a dynamic bit mask;
a test engine coupled with the memory element and the circuit, the test engine configured to test a bit write operation to the memory element by performing a method comprising:
    defining a set of bit write address bit groups and their respective decodes based on a set of input bits from an address to be tested of a memory location in the memory element, wherein each respective decode comprises a multi-input, multi-output combination that converts a binary code of M input lines into one of N outputs, and wherein the set of input bits are taken from predetermined bit locations in the address;
    generating an encoded binary number in a predetermined range of 1 to M based on the set of input bits from the address;
    generating, from the encoded binary number, a decoded binary number in a predetermined range of 1 to N;
    generating, using the circuit, from a bit pattern of the decoded binary number, the dynamic bit mask for the bit groups;
    generating, from a bit pattern of the encoded binary number, expect data;
    performing a bit write operation comprising a partial write to the address to store a sequence of bits, the sequence of bits selected using a predetermined bit pattern testing algorithm configured to test bit write capability;
    reading a content of the address; and
    comparing bits selected using the dynamic bit mask to the expect data.

8. The system of claim 7, wherein the test engine is a built-in self-test engine of the system.

9. The system of claim 7, wherein the method further comprises:
repeating the test for a number of times equal to the encoded binary number.

10. The system of claim 7, wherein the predetermined bit pattern is selected based on a predetermined selected algorithm.

11. The system of claim 10, wherein the test is iterated with a plurality of predetermined bit patterns.

12. The system of claim 7, wherein the set of bits from the address is a predetermined selection.

13. An apparatus for implementing diagnostics of a circuit, the apparatus comprising:
a test engine configured to test a memory element of the circuit by testing a bit write operation to the memory element by performing a method comprising;
    defining a set of bit write address bit groups and their respective decodes based on a set of input bits from an address to be tested of a memory location in the memory element, wherein each respective decode comprises a multi-input, multi-output combination that converts a binary code of M input lines into one of N outputs, and wherein the set of input bits are taken from predetermined bit locations in the address;
    generating an encoded binary number in a predetermined range of 1 to M based on the set of input bits from the address;
    generating, from the encoded binary number, a decoded binary number in a predetermined range of 1 to N;

generating, using the circuit, from a bit pattern of the decoded binary number, the dynamic bit mask for the bit group;

generating, from a bit pattern of the encoded binary number, expect data;

performing a bit write operation comprising a partial write to the address to store a sequence of bits, the sequence of bits selected using a predetermined bit pattern testing algorithm configured to test bit write capability;

reading a content of the address; and comparing bits selected using the dynamic bit mask to the expect data.

14. The apparatus of claim 13, wherein the testing further comprises:

repeating the test for a number of times equal to the encoded binary number.

15. The apparatus of claim 13, wherein the predetermined bit pattern is selected based on a predetermined selected algorithm.

16. The apparatus of claim 15, wherein the test is iterated with a plurality of predetermined bit patterns.

17. The apparatus of claim 13, wherein the set of bits from the address is a predetermined selection.

* * * * *